United States Patent
Goldblatt

(10) Patent No.: US 9,722,585 B2
(45) Date of Patent: *Aug. 1, 2017

(54) CIRCUIT AND METHOD TO EXTEND A SIGNAL COMPARISON VOLTAGE RANGE

(71) Applicant: QUALCOMM Incorporated, San Diego, CA (US)

(72) Inventor: Jeremy Goldblatt, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/144,929

(22) Filed: May 3, 2016

(65) Prior Publication Data

US 2016/0248407 A1    Aug. 25, 2016

Related U.S. Application Data

(62) Division of application No. 13/797,645, filed on Mar. 12, 2013, now Pat. No. 9,356,586.

(51) Int. Cl.
| | |
|---|---|
| H03K 5/00 | (2006.01) |
| H03K 3/356 | (2006.01) |
| H03K 3/012 | (2006.01) |
| H03K 19/00 | (2006.01) |
| H03K 5/24 | (2006.01) |

(52) U.S. Cl.
CPC ......... *H03K 3/35613* (2013.01); *H03K 3/012* (2013.01); *H03K 3/356139* (2013.01); *H03K 5/00* (2013.01); *H03K 5/249* (2013.01); *H03K 5/2481* (2013.01); *H03K 19/0016* (2013.01)

(58) Field of Classification Search
None
See application file for complete search history.

(56) References Cited

U.S. PATENT DOCUMENTS

| | | | |
|---|---|---|---|
| 4,047,059 A | 9/1977 | Rosenthal | |
| 5,583,457 A | 12/1996 | Horiguchi et al. | |
| 5,751,651 A * | 5/1998 | Ooishi | G11C 11/4085 365/226 |
| 6,353,342 B1 | 3/2002 | Alvandpour et al. | |
| 6,791,369 B1 | 9/2004 | Hattori | |

(Continued)

FOREIGN PATENT DOCUMENTS

CN    1143314 C    3/2004

OTHER PUBLICATIONS

International Search Report and Written Opinion—PCT/US2014/021835—ISA/EPO—Jun. 26, 2014.

*Primary Examiner* — Long Nguyen
(74) *Attorney, Agent, or Firm* — Patterson & Sheridan, L.L.P.

(57) ABSTRACT

A circuit to a extend signal comparison voltage range includes a latching circuit and a comparator responsive to common-mode input signals. The comparator is coupled to the latching circuit and to a dynamic node. The circuit also includes a clocked boost circuit coupled to the dynamic node. The clocked boost circuit is configured to extend a supply voltage range of the comparator via biasing the dynamic node. A method to extend a signal comparison voltage range includes selectively shifting a voltage level of one of a ground reference of a dynamic circuit or a supply reference of the dynamic circuit in response to a clock signal.

6 Claims, 6 Drawing Sheets

(56) References Cited

U.S. PATENT DOCUMENTS

| | | |
|---|---|---|
| 7,221,190 B2 | 5/2007 | Partow et al. |
| 8,030,999 B2 | 10/2011 | Chatterjee et al. |
| 8,081,097 B2 | 12/2011 | Hsu |
| 9,356,586 B2 * | 5/2016 | Goldblatt .................. H03K 5/00 |
| 2001/0040834 A1 | 11/2001 | Ooishi |
| 2004/0263213 A1 | 12/2004 | Kiehl et al. |
| 2005/0285628 A1 * | 12/2005 | Kim ................... H03K 19/0019 326/112 |
| 2009/0009236 A1 | 1/2009 | Saitoh |
| 2014/0266307 A1 | 9/2014 | Goldblatt |

* cited by examiner

CIRCUIT AND METHOD TO EXTEND A
SIGNAL COMPARISON VOLTAGE RANGE

CLAIM OF PRIORITY UNDER 35 U.S.C. §119

This application is a divisional of U.S. patent application Ser. No. 13/797,645, entitled "CIRCUIT AND METHOD TO EXTEND A SIGNAL COMPARISON VOLTAGE RANGE," which was filed on Mar. 12, 2013, the entire contents of which are incorporated herein by reference.

FIELD

The present disclosure is generally related to comparison circuits.

DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Supply voltages (Vdd) used in electronic devices, such as wireless telephones, generally decrease as technology advances. However, threshold voltages of transistors, such as field effect transistors (FETs), used in complementary metal-oxide semiconductor (CMOS) devices have not decreased as rapidly as decreases in supply voltages. One result of decreasing a voltage supply (Vdd) without a proportional decrease in transistor threshold voltage is decreased performance of comparison circuits (e.g., a comparator). For example, a comparator may generate a comparison result between two common-mode input signals by providing a first input signal to a gate of a first transistor and providing a second input signal to a gate of a second transistor. A voltage difference between the common-mode input signals may result in a current difference through the respective transistors, enabling different rates of discharging pre-charged nodes that are coupled to the transistors. However, when the voltage of the common-mode input signals (e.g., the first and second input signals) is approximately half of a voltage range (e.g., Vdd-Vss) of the comparator, the voltage of the common-mode input signals may be less than the threshold voltage of the transistors of the comparator, resulting in significantly reduced current through the transistors during a comparison operation and extended comparison times.

SUMMARY

Circuits and methods to extend a voltage range of a comparison circuit are disclosed. A comparator may generate a comparison result between two common-mode input signals by providing a first input signal to a gate of a first transistor and providing a second input signal to a gate of a second transistor. A negative terminal of the comparator may be coupled to a dynamic node. During a reset phase, a clocked circuit may shift a voltage of the dynamic node to ground (Vss). During a comparison phase, the clocked circuit may shift the voltage of the dynamic node to a voltage that is less than ground (Vss) (i.e., shift the voltage of the dynamic node to a negative voltage) to extend the voltage range of the comparator.

In a particular embodiment, a circuit includes a latching circuit and a comparator responsive to common-mode input signals. The comparator is coupled to the latching circuit and to a dynamic node. The circuit also includes a clocked boost circuit coupled to the dynamic node. The clocked boost circuit is configured to extend a supply voltage range of the comparator via biasing the dynamic node.

In another particular embodiment, a circuit includes a latching circuit and a comparator that is responsive to common-mode input signals. The comparator is coupled to the latching circuit and to a dynamic node. The circuit also includes a clocked circuit that includes a capacitor coupled to the dynamic node. The capacitor is selectively charged in response to a clock signal and the capacitor selectively biases the dynamic node.

In another particular embodiment, a method to extend a signal comparison voltage range includes selectively shifting a voltage level of one of a ground reference of a dynamic circuit or a supply reference of the dynamic circuit in response to a clock signal.

One particular advantage provided by at least one of the disclosed embodiments is an extended range of a comparator, as compared to comparators not coupled to a negative voltage ground reference, resulting from selectively decreasing a voltage of a negative terminal of the comparator to at least partially compensate for a decreased supply voltage of the comparator. Other aspects, advantages, and features of the present disclosure will become apparent after review of the entire application, including the following sections: Brief Description of the Drawings, Detailed Description, and the Claims.

DETAILED DESCRIPTION

Figure 1:
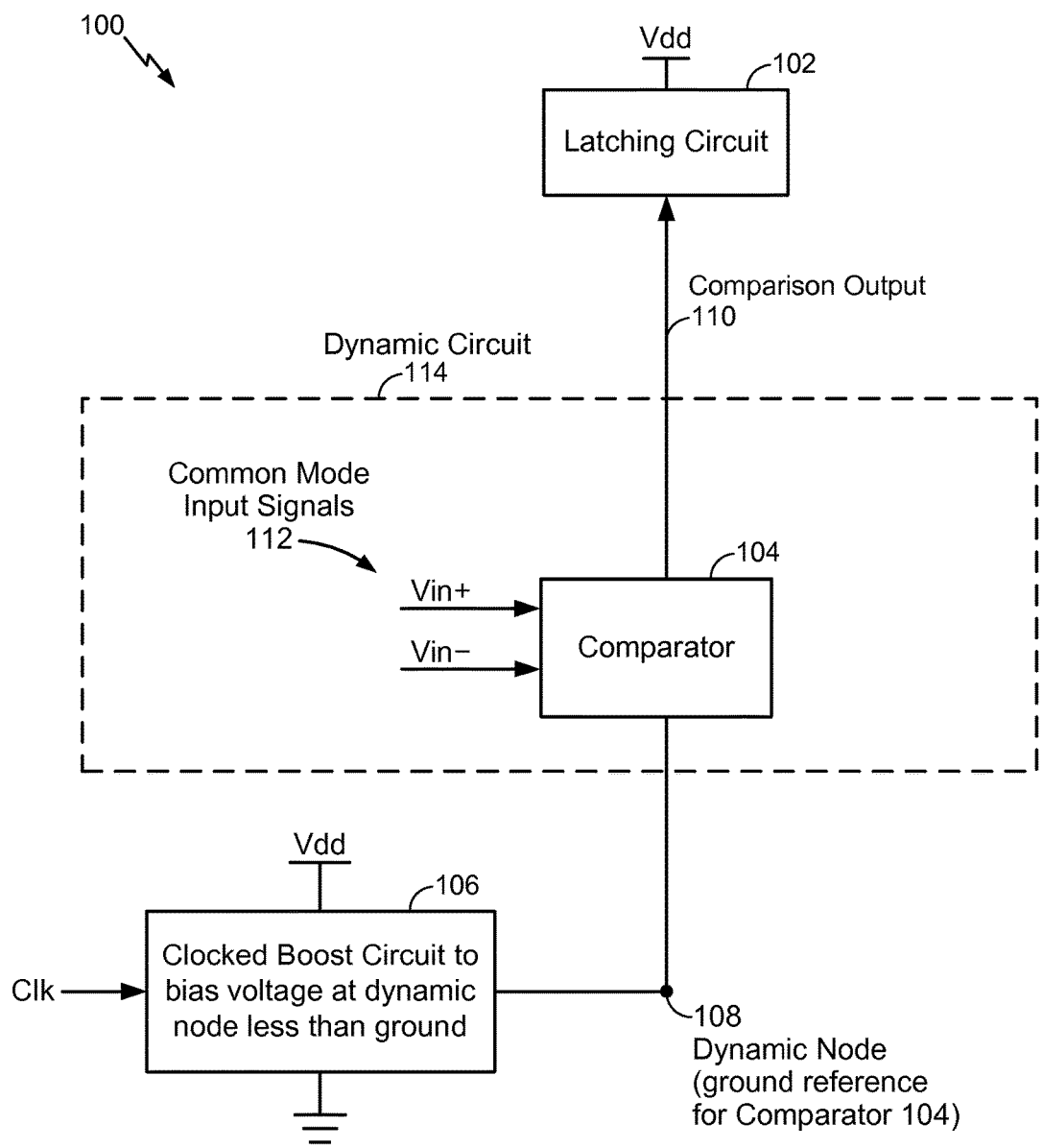
FIG. 1 is a block diagram of a particular illustrative embodiment of a system that is operable to extend a voltage range of a comparison circuit.

Referring to FIG. 1, a particular illustrative embodiment of a system 100 that is operable to extend a voltage range of a comparison circuit is shown. The system 100 includes a latching circuit 102, a dynamic circuit 114, and a clocked circuit 106. The dynamic circuit 114 includes a comparison circuit, illustrated as a comparator 104. The latching circuit 102 is coupled to receive a comparison output signal 110 from the comparator 104. The clocked circuit 106 is coupled to the comparator 104 via a dynamic node 108.

The comparator 104 is configured to receive and to be responsive to a pair of common-mode input signals 112 (e.g., a differential signal pair). For example, the comparator 104 is configured to receive a first input signal (Vin+) at a first input and to receive a second input signal (Vin−) at a second input. In a particular embodiment, the first input may be coupled to a gate of a first transistor of the comparator 104 and the second input may be coupled to a gate of a second transistor of the comparator 104, as described in further detail with respect to FIG. 2. The drain terminals of the first and second transistors may be coupled to generate the comparison output signal 110 based on the first input signal (Vin+) and the second input signal (Vin−). The source terminals of the first and second transistors of the comparator 104 may be coupled to the dynamic node 108. In a particular embodiment, the dynamic node 108 may provide a ground reference of the comparator 104.

The latching circuit 102 is configured to receive the comparison output signal 110 and to latch the comparison output signal 110 in response to a pre-charged node dropping below a threshold. For example, as described in further detail with respect to the embodiments of FIGS. 2-3, the comparison output signal 110 may affect a discharge rate of a pair of pre-charged nodes (i.e., a first pre-charged node and a second pre-charged node). The first pre-charged node may be discharged at a greater rate than the second pre-charged node when the first input signal (Vin+) has a greater voltage level than the second input signal (Vin−). The second pre-charged node may be discharged at a greater rate than the first pre-charged node when the second input signal (Vin−) has a greater voltage level than the first input signal (Vin+).

The clocked circuit 106 is configured to receive a clock signal (Clk) and to selectively set a voltage level at the dynamic node 108 in response to receiving the clock signal (Clk). For example, the clocked circuit 106 may selectively bias a voltage level of the dynamic node 108 to ground (or higher). Additionally, the clocked circuit 106 may selectively bias the voltage level of the dynamic node 108 to less than ground (i.e., to a negative voltage level) to 'boost' a supply voltage range of the comparator 104. Biasing the voltage level of the dynamic node 108 to less than ground may boost a common mode voltage of the pair of common-mode input signals 112 (e.g., the differential signal pair).

During operation, the clocked circuit 106 biases the voltage level of the dynamic node 108 to ground in response to the clock signal (Clk) transitioning to a logic low voltage level. When the voltage level of the dynamic node 108 is biased to ground, the gate-to-source voltages of the first and second transistors of the comparator 104 may be less than the threshold voltages of the first and second transistors, causing the first and second transistors to deactivate (or operate in a low conductivity state, such as a triode region of operation). The clocked circuit 106 biases the voltage level of the dynamic node 108 to less than ground in response to the clock signal (Clk) transitioning to a logic high voltage level. When the voltage level of the dynamic node 108 is biased to a voltage that is less than ground, the gate-to-source voltages of the first and second transistors receiving the first and second input signals (Vin+, Vin−), respectively, may increase to a voltage level greater than the threshold voltages. As a result, the first and second transistors may be activated (or operate in a high conductivity state, such as a saturation region of operation). When the first and second transistors are activated, the comparison output signal 110 may indicate a comparison result of the comparator 104, such as described in further detail with respect to FIGS. 2-3.

It will be appreciated that the system 100 of FIG. 1 may reduce battery power by selectively biasing the dynamic node 108 to activate the comparator 104 (i.e., the first and second transistors) without increasing a voltage supply (Vdd) supplied to the comparator 104. For example, biasing the dynamic node 108 to a negative voltage (i.e., a voltage less than ground) may increase a voltage range of the comparator 104 without increasing the voltage supply (Vdd), avoiding additional power consumption of an increased voltage supply (Vdd).

Figure 2:
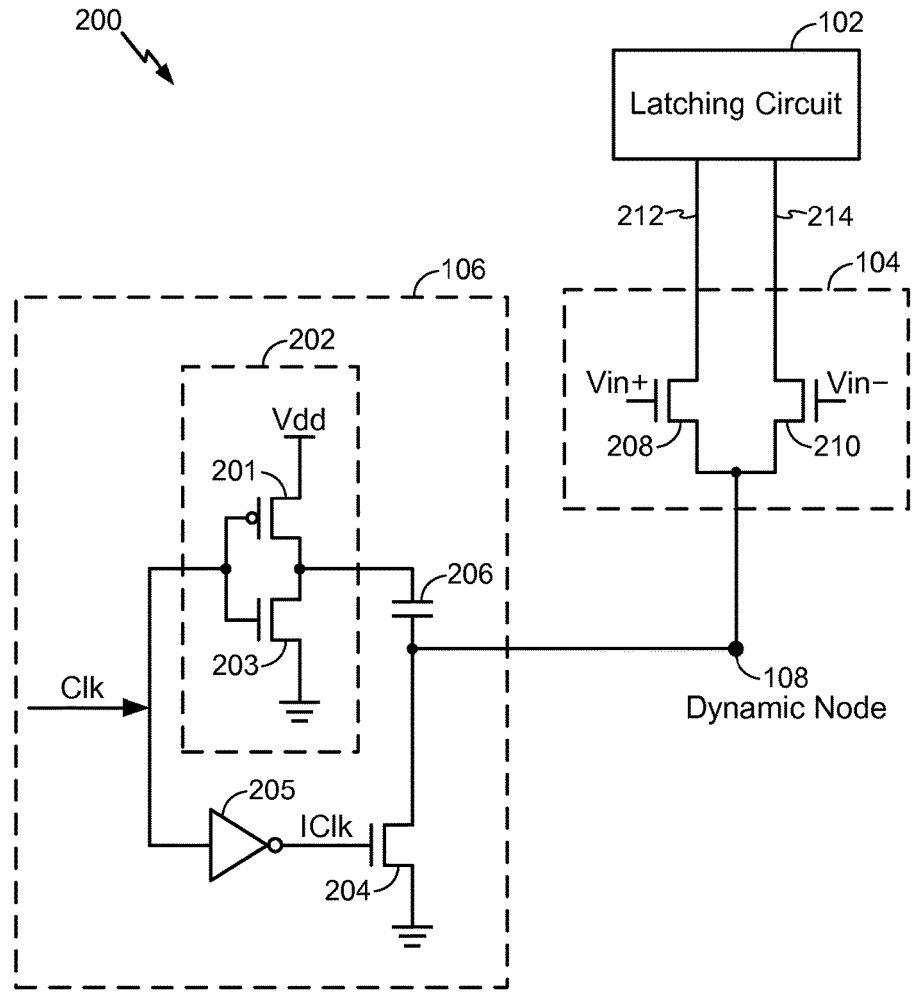
FIG. 2 is a diagram illustrating a reset phase of a particular embodiment of the system of FIG. 1.
Figure 2:
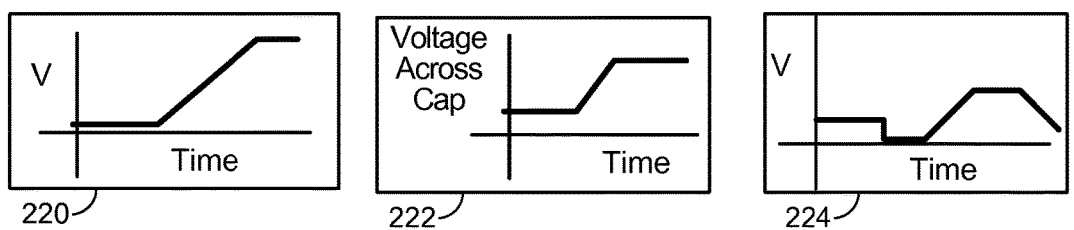

Referring to FIG. 2, a reset phase of a circuit 200 that is operable to extend a voltage range of a comparison circuit is shown. The circuit 200 includes the latching circuit 102, the comparator 104, and the clocked circuit 106 of FIG. 1. In a particular embodiment, the clocked circuit 106 may include a clocked boost circuit.

The comparator 104 includes a first transistor 208, such as a first n-type metal-oxide semiconductor (NMOS) transistor, and a second transistor 210, such as a second NMOS transistor. A source of the first transistor 208 is coupled to the dynamic node 108 and a drain of the first transistor 208 is coupled to a first pre-charged node 212. A gate of the first transistor 208 is coupled to receive the first input signal (Vin+) of the two common-mode input signals 112. A source of the second transistor 210 is coupled to the dynamic node 108 and a drain of the second transistor 210 is coupled a second pre-charged node 214. A gate of the second transistor 210 is coupled to receive the second input signal (Vin−) of the two common-mode input signals 112. Thus, the first transistor 208 may be coupled to the dynamic node 108 and responsive to the first input signal (Vin+) and the second transistor 210 may be coupled to the dynamic node 108 and responsive to the second input signal (Vin−).

The clocked circuit 106 includes a first inverter 202 that may include a first p-type metal oxide semiconductor (PMOS) transistor 201 and a third NMOS transistor 203. The clocked circuit 106 further includes a switch 204 (e.g., a fourth NMOS transistor), a second inverter 205, and a capacitor 206. An input of the first inverter 202 is coupled to receive the clock signal (Clk) and an output (e.g., a drain of the first PMOS transistor 201) is coupled to a first terminal (i.e., a positive terminal) of the capacitor 206.

The second inverter 205 is coupled to receive the clock signal (Clk). The second inverter 205 is configured to generate an inverted clock signal (IClk) in response to receiving the clock signal (Clk). A gate of the fourth NMOS transistor (i.e., the switch 204) is coupled to receive the inverted clock signal (IClk). A source of the fourth NMOS transistor is coupled to ground and a drain of the fourth NMOS transistor 204 is coupled to a second terminal (i.e., a negative terminal) of the capacitor 206. The capacitor 206 is coupled to the dynamic node 108.

During the reset phase, the clocked circuit 106 selectively shifts a voltage level of the dynamic node 108 to ground in response to the clock signal (Clk). For example, during the reset phase, the clock signal (Clk) transitions from a logic high voltage level to a logic low voltage level. The clock signal (Clk) is provided to the gate of the first PMOS transistor 201 and to the gate of the third NMOS transistor 203. In response to receiving the clock signal (Clk) having a logic low voltage level, the first PMOS transistor 201 is activated and the third NMOS transistor 203 is deactivated. The first PMOS transistor 201 is configured to selectively charge the capacitor 206 in response to the logic low voltage level of the clock signal (Clk). For example, the first PMOS transistor 201 may function as a pull-up transistor that charges the capacitor 206 based on the voltage supply (Vdd) upon activation.

The clock signal (Clk) is also provided to the second inverter 205 and the second inverter 205 generates the inverted clock signal (IClk) having a logic high voltage level. The second inverter 205 provides the inverted clock signal (IClk) to the gate of the switch 204. In response to receiving the inverted clock signal (IClk) having the logic high voltage level, the switch 204 is activated to couple the dynamic node 108 and the second terminal of the capacitor 206 to ground. Thus, during the reset phase, the first terminal of the capacitor 206 of the clocked circuit 106 is coupled to the voltage supply (Vdd) via the first PMOS transistor 201 and the second terminal of the capacitor 206 is coupled to ground to charge the capacitor 206.

A voltage at the first terminal of the capacitor 206 as a function of time during the reset phase is illustrated in a first timing diagram 220. Referring to the first timing diagram 220, the voltage of at the first terminal of the capacitor 206 increases during the reset phase as time increases. The increase in voltage at the first terminal may be attributed to first PMOS transistor 201 enabling charging of the capacitor 206 based on the voltage supply (Vdd) when the first PMOS transistor 201 is activated in response to the logic low clock signal (Clk).

A voltage across the capacitor 206 as a function of time during the reset phase is illustrated in a second timing diagram 222. Referring to the second timing diagram 222, the voltage across the capacitor 206 increases during the reset phase as time increases. However, the voltage across the capacitor 206 does not increase to a level consistent with the voltage at the first terminal of the capacitor 206 because the capacitor 206 may have a non-zero device conductance. For example, it may take a finite time to charge the capacitor 206 and a distinct finite time to discharge the capacitor 206 so that the time-averaged charge is non-zero. As a result, the first PMOS transistor 201 may pull the dynamic node 108 to a higher voltage rather than charging the capacitor 206 if the capacitor 206 is fully charged while the PMOS transistor 201 is activated.

A voltage at the dynamic node 108 is illustrated in a third timing diagram 224. When the clock signal (Clk) transitions to the logic low voltage level, the voltage at the dynamic node 108 falls to approximately ground. The voltage at the dynamic node 108 tracks the voltage at the first terminal of the capacitor 206 (i.e., the voltage rises from ground) for a portion of the reset phase due to a non-zero device conductance. Thus, during the reset phase, the capacitor 206 is selectively charged in response to the clock signal (Clk).

When the voltage level of the dynamic node 108 is biased to approximately ground, the gate-to-source voltages of the first and second transistors 208, 210 may be smaller than the threshold voltages of the first and second transistors 208, 210, respectively. The first and second transistors 208, 210 may be deactivated (or may operate in a mode of operation with a small conduction rate, such as a triode region of operation) when the gate-to-source voltages are smaller than the threshold voltages. Deactivating the first and second transistors 208, 210 may result in substantially no discharge current flowing through the transistors 208, 210, and the comparator 104 may enter into an "off" state.

It will be appreciated that the circuit 200 of FIG. 2 may reduce power consumption by turning off the comparator 104 when comparison between the common-mode input signals 112 (i.e., the first input signal (Vin+) and the second input signal (Vin−) is postponed. For example, the clocked circuit 106 may selectively bias the dynamic node 108 to turn off or reset the comparator 104. In particular, the clocked circuit 106 may bias the dynamic node 108 to approximately ground. As a result, the gate-to-source voltages of the first and second transistors 208, 210 may be smaller than the threshold voltages of the first and second transistors 208, 210, respectively. When the gate-to-source voltages of the transistors 208, 210 are smaller than the threshold voltage of the transistors 208, 210, the transistors 208, 210 (i.e., the comparator 104) may be deactivated (or operate in a low conductivity state) which may reduce power consumption. It will also be appreciated that the circuit 200 of FIG. 2 may charge the capacitor 206 for use in biasing the dynamic node 108 during a comparison phase, as described with respect to FIG. 3.

The timing diagrams 220-224 illustrated in FIG. 2 are for illustrative purposes and are provided for clarity of explanation. Information in the timing diagrams 220-224 may vary according to various implementations of the circuit 200 of FIG. 2. For example, the traces in the timing diagrams 220-224 may be curved rather than piece-wise linear and may have fluctuations resulting from process, temperature, and voltage (PVT) conditions. Further, the timing diagrams 220-224 may not be drawn to scale.

Figure 3:
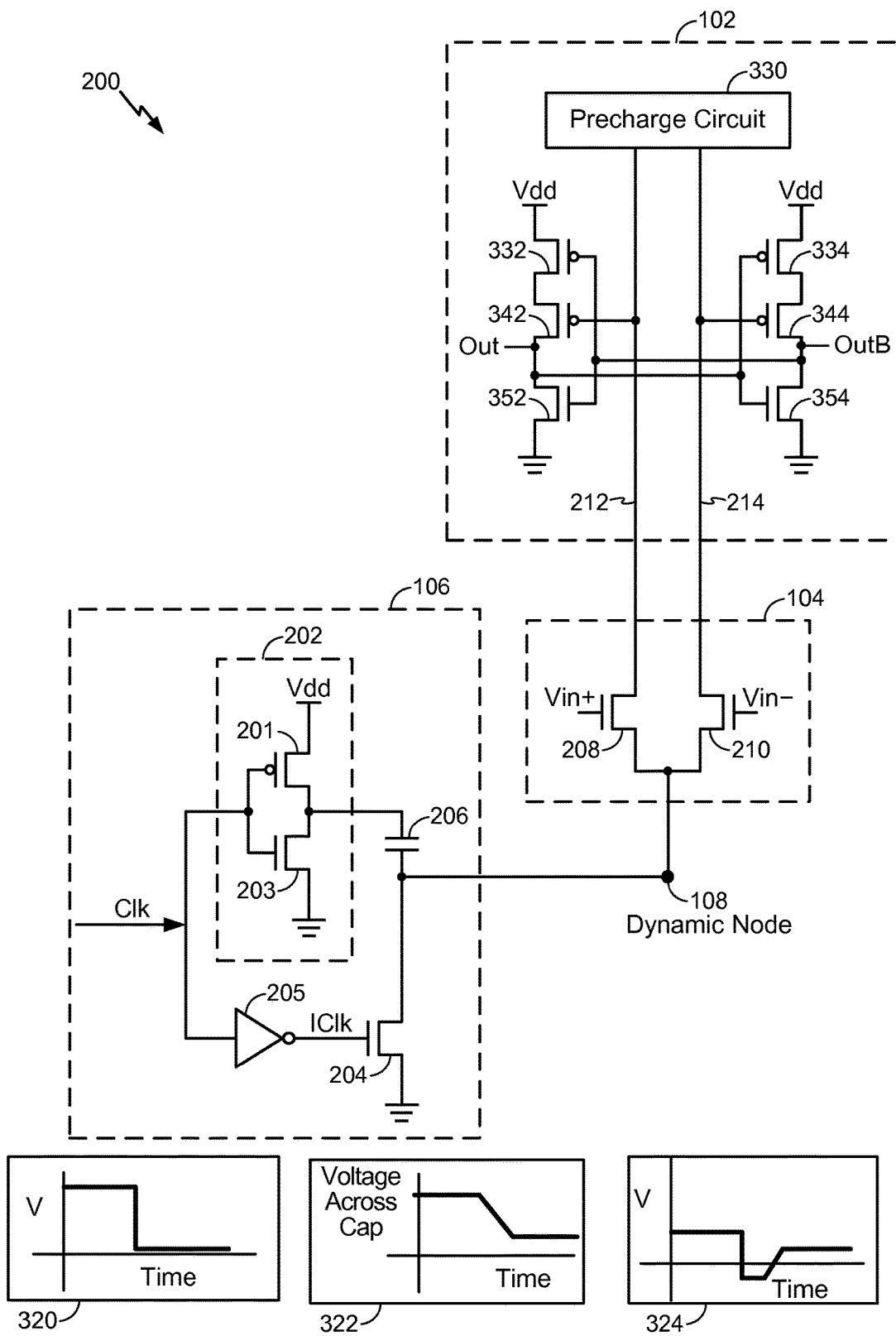
FIG. 3 is a diagram illustrating a comparison phase of a particular embodiment of the system of FIG. 1.

Referring to FIG. 3, a comparison phase of the circuit 200 that is operable to extend a voltage range of a comparison circuit is shown. The circuit 200 includes the latching circuit 102, the comparator 104, and the clocked circuit 106. In a particular embodiment, the clocked circuit 106 may include a clocked boost circuit.

FIG. 3 illustrates an example implementation of the latching circuit 102 as including a pre-charge circuit 330 coupled to the first and second pre-charged nodes 212, 214. The latching circuit 102 also includes a pair of cross-coupled inverters. The first inverter of the pair of cross-coupled inverters includes a second PMOS transistor 332 and a fifth NMOS transistor 352. A gate of the second PMOS transistor 332 is coupled to a gate of the fifth NMOS transistor 352. A source of the second PMOS transistor 332 is coupled to receive a voltage supply (Vdd) and a drain of the second PMOS transistor 332 is coupled to a source of a third PMOS transistor 342. A source of the fifth NMOS transistor 352 is coupled to ground and a drain of the fifth NMOS transistor 352 is coupled to a drain of the third PMOS transistor 342. A gate of the third PMOS transistor 342 is coupled to the first pre-charged node 212. The second inverter of the pair of cross-coupled inverters includes a fourth PMOS transistor 334 and a sixth NMOS transistor 354. A gate of the fourth PMOS transistor 334 is coupled to a gate of the sixth NMOS transistor 354. A source of the fourth PMOS transistor 334 is coupled to receive the voltage supply (Vdd) and a drain of the fourth PMOS transistor 334 is coupled to a source of a fifth PMOS transistor 344. A source of the sixth NMOS transistor 354 is coupled to ground and a drain of the sixth NMOS transistor 354 is coupled to a drain of the fifth PMOS transistor 344. A gate of the fifth PMOS transistor 344 is coupled to the second pre-charged node 214.

During the comparison phase, the clocked circuit 106 uses the charged capacitor 206 to selectively shift a voltage level of the dynamic node 108 below ground (i.e., shift the voltage level of the dynamic node 108 to a negative voltage level) in response to the clock signal (Clk). For example, during the comparison phase, the clock signal (Clk) transitions from a logic low voltage level to a logic high voltage level. The clock signal (Clk) is provided to the gate of the first PMOS transistor 201 and to the gate of the third NMOS transistor 203. In response to receiving the clock signal (Clk) having a logic high voltage level, the first PMOS transistor 201 is deactivated and the third NMOS transistor 203 is activated. As a result, the third NMOS transistor 203 selectively couples the first terminal of the capacitor 206 to ground in response to the logic high voltage level of the clock signal (Clk). For example, a voltage at the first terminal of the capacitor 206 as a function of time during the comparison phase is illustrated in a first timing diagram 320. Referring to the first timing diagram 320, the voltage at the first terminal of the capacitor 206 decreases to approximately ground during the comparison phase when the clock signal transitions from a logic low voltage level to a logic high voltage level. The decrease in voltage at the first terminal may be attributed to the third NMOS transistor 203 coupling the first terminal of the capacitor 206 to ground.

The clock signal (Clk) is also provided to the second inverter 205, and the second inverter 205 generates the inverted clock signal (IClk) having a logic low voltage level. The second inverter 205 provides the inverted clock signal (IClk) to the gate of the switch 204. In response to receiving the inverted clock signal (IClk) having the logic low voltage level, the switch 204 is deactivated. Deactivating the switch 204 may function to decouple the second terminal of the capacitor 206 from ground. Thus, during the comparison phase, the first terminal of the capacitor 206 of the clocked circuit 106 is coupled to ground via the third NMOS transistor 203 and the second terminal of the capacitor 206 is decoupled from ground in response to turning off the switch 204 (i.e., the fourth NMOS transistor). The second terminal of the capacitor 206 is coupled to the dynamic node 108 and may be responsive to a discharge current through the first and second transistors 208, 210 (i.e., the second terminal of the capacitor 206 may be coupled to receive a negative charge). As a result, the voltage across the capacitor 206 as a function of time during the comparison phase decreases when the clock signal transitions from a logic low voltage level to a logic high voltage level. The voltage across the capacitor 206 as a function of time during the comparison phase is illustrated in a second timing diagram 322.

The dynamic node 108 is coupled to the capacitor 206 and the voltage at the dynamic node 108 may track the rate at which the capacitor 206 discharges. For example, the voltage at the dynamic node 108 is illustrated in a third timing diagram 324. When the clock signal (Clk) transitions to the logic high voltage level, the voltage at the dynamic node 108 falls to a voltage less than ground (i.e., falls to a negative voltage). In particular, the third NMOS transistor 203 and the switch 204 (i.e., the fourth NMOS transistor) drive the dynamic node 108 to a negative voltage using the voltage built across the capacitor 206 during the reset phase. In response to the dynamic node 108 having a negative voltage, the first and second transistors 208, 210 may be activated. Current flowing through the first and second transistors 208, 210 may discharge the capacitor 206. Thus, during the comparison phase, the capacitor 206 is selectively discharged in response to the clock signal (Clk) and selectively biases the dynamic node 108 (i.e., biases the voltage of the dynamic node 108 to a voltage level less than ground).

When the voltage level of the dynamic node 108 is biased to a voltage level less than ground (i.e. biased to a negative voltage), the voltage range of the comparator 104 is extended as compared to when the voltage level of the dynamic node 108 is biased to approximately ground during the reset phase as described with respect to FIG. 2. Extending the voltage range of the comparator 104 by biasing the voltage level of the dynamic node 108 (i.e., biasing the voltage level of the source of the first transistor 208) and maintaining the voltage level of the first input signal (Vin+) may increase the gate-to-source voltage of the first transistor 208 to a level that is greater than the threshold voltage of the first transistor 208. In a similar manner, extending the voltage range of the comparator 104 by biasing the voltage level of the dynamic node 108 (i.e., biasing the voltage level of the source of the second transistor 210) and maintaining the voltage level of the second input signal (Vin−) may increase the gate-to-source voltage of the second transistor 210 to a level that is greater than the threshold voltage of the second transistor 210. When the gate-to-source voltages of the first and second transistors 208, 210 are greater than the threshold voltages of the first and second transistors 208, 210, respectively, the first and second transistors 208, 210 may be activated to discharge the first and second pre-charged nodes 212, 214, respectively. As explained below, because the sources of the first and second transistors 208, 210 are coupled to a common voltage (i.e., the dynamic node 108), if the first and second transistors 208, 210 have similar characteristics (i.e., similar threshold voltages), a first and second output (Out, OutB) of the latching circuit 102 may determine the voltage difference between the first and second input signals (Vin+, Vin).

The pre-charge circuit 330 charges the first and second pre-charged nodes 212, 214 to a pre-charge level during the reset phase and the pre-charge circuit 330 may deactivate during the comparison phase. When the first and second transistors 208, 210 are activated, the first and second transistors 208, 210 function as pull-down transistors and begin to discharge the first and second pre-charged nodes 212, 214, respectively. The third PMOS transistor 342 is responsive to a voltage of the first pre-charged node 212, and the fifth PMOS transistor 344 is responsive to a voltage of the second pre-charged node 214. For example, as the voltage of the first pre-charged node 212 decreases, the rate at which the third PMOS transistor 342 conducts current increases. In addition, as the voltage of the second pre-charged node 214 decreases, the rate at which the fifth PMOS transistor 344 conducts current increases.

When the voltage at the first pre-charged node 212 drops to a sufficient level to activate the third PMOS transistor 342 (or drops to a sufficient level to change the mode of operation of the third PMOS transistor 342 from a triode region to a saturation region), the first inverter 332, 352 of the pair of cross-coupled inverters toggles and outputs a high voltage signal at the first output (Out) of the latching circuit 102. The high voltage signal at the first output (Out) drives the second inverter 334, 354 of the pair of cross-coupled inverters to maintain a low voltage signal at the second output (OutB) of the latching circuit 102. For example, the high voltage signal at the first output (Out) may be applied to the gate of the sixth NMOS transistor 354 and to the gate of the fourth PMOS transistor 334. As a result, the sixth NMOS transistor 354 may function as a pull-down transistor and couple the second output (OutB) to ground and the fourth PMOS transistor 334 may be deactivated (or operate in a low conductivity state). When the voltage at the second pre-charged node 214 drops to a sufficient level to activate the fifth PMOS transistor 344 (or drops to a sufficient level to change the mode of operation of the fifth PMOS transistor 344 from a triode region to a saturation region), the second inverter 334, 354 of the pair of cross-coupled inverters toggles and outputs a high voltage signal at the second output (OutB). The high voltage signal at the second output (OutB) drives the first inverter 332, 352 of the pair of cross-coupled inverters to maintain a low voltage signal at the first output (Out). For example, the high voltage signal at the second output (OutB) may be applied to the gate of the fifth NMOS transistor 352 and to the gate of the second PMOS transistor 332. As a result, the fifth NMOS transistor 352 may function as a pull-down transistor and couple the first output (Out) to ground and the second PMOS transistor 332 may be deactivated (or operate in a low conductivity state).

The first and second outputs (Out, OutB) of the latching circuit 102 indicate a relative voltage difference between the first input signal (Vin+) and the second input signal (Vin−) of the common-mode input signals 112. For example, when the first input signal (Vin+) has a voltage level greater than the second input signal (Vin−), the first transistor 208 may conduct at a greater rate than the second transistor 210 resulting in the first pre-charged node 212 discharging at a greater rate than the second pre-charged node 214. When the first pre-charged node 212 discharges at greater rate than the second pre-charged node 214, the voltage applied to the gate of the third PMOS transistor 342 (i.e., the voltage of the first pre-charged node 212) activates the third PMOS transistor 342 and the first inverter 332, 352 outputs the high voltage signal at the first output (Out). Thus, when the first input signal (Vin+) has a greater voltage than the second input signal (Vin−), the first output (Out) of the latching circuit 102 generates a high voltage signal.

Alternatively, when the second input signal (Vin−) has a voltage level greater than the first input signal (Vin+), the second transistor 210 may conduct at a greater rate than the first transistor 208 resulting in the second pre-charged node 214 discharging at a greater rate than the first pre-charged node 212. When the second pre-charged node 214 discharges at greater rate than the first pre-charged node 212, the voltage applied to the gate of the fifth PMOS transistor 344 (i.e., the voltage of the second pre-charged node 214) activates the fifth PMOS transistor 344 and the second inverter 334, 354 outputs the high voltage signal at the second output (OutB). Thus, when the second input signal (Vin−) has a greater voltage than the first input signal (Vin+), the second output (OutB) of the latching circuit 102 generates a high voltage signal. Thus, the outputs (Out, OutB) indicate whether a first discharge rate through the first transistor 208 to the ground reference (i.e., the dynamic node 108) exceeds a second discharge rate through the second transistor 210 to the ground reference.

In a particular embodiment, the comparator 104 may be a dynamic latched comparator that is configured to generate an output to a latching circuit based on a first discharge rate through a first transistor of the comparator 104 to the ground reference and a second discharge rate through a second transistor of the comparator to the ground reference. For example, in FIG. 3, the comparator 104 may generate the first and second outputs (Out, OutB) to the latching circuit 102 based on the first discharge rate through the first transistor 208 of the comparator 104 (i.e., the rate at which the first transistor 208 discharges the first pre-charged node 212). In addition, the comparator 104 may generate the first and second outputs (Out, OutB) to the latching circuit 102 based on the second discharge rate through the second transistor 210 of the comparator 104 (i.e., the rate at which the second transistor 210 discharges the second pre-charged node 214).

It will be appreciated that the circuit 200 of FIG. 3 may extend a voltage range of the comparator 104 to activate the first and second transistors 208, 210. For example, the clocked circuit 106 may selectively bias the dynamic node 108 to a negative voltage (i.e., a voltage less than ground) to increase the gate-to-source voltage of the first and second transistors 208, 210 to a voltage level greater than a threshold voltage of the first and second transistors 208, 210. Increasing the gate-to-source voltage of the first and second transistors 208, 210 may enable the transistors 208, 210 to activate (or operate in a saturation region of operation) without increasing a voltage supply (Vdd) of the comparator 104 (i.e., the first and second transistors 208, 210). It will further be appreciated that extending the voltage range of the comparator 104 without increasing the voltage supply (Vdd) of the comparator 104 may reduce battery power consumption.

The timing diagrams 320-324 illustrated in FIG. 3 are for illustrative purposes and are provided for clarity of explanation. Information in the timing diagrams 320-324 may vary according to various implementations of the circuit 200 of FIG. 3. For example, the traces in the timing diagrams 320-324 may be curved rather than piece-wise linear and may have fluctuations resulting from process, temperature, and voltage (PVT) conditions. Further, the timing diagrams 320-324 may not be drawn to scale.

Figure 4:
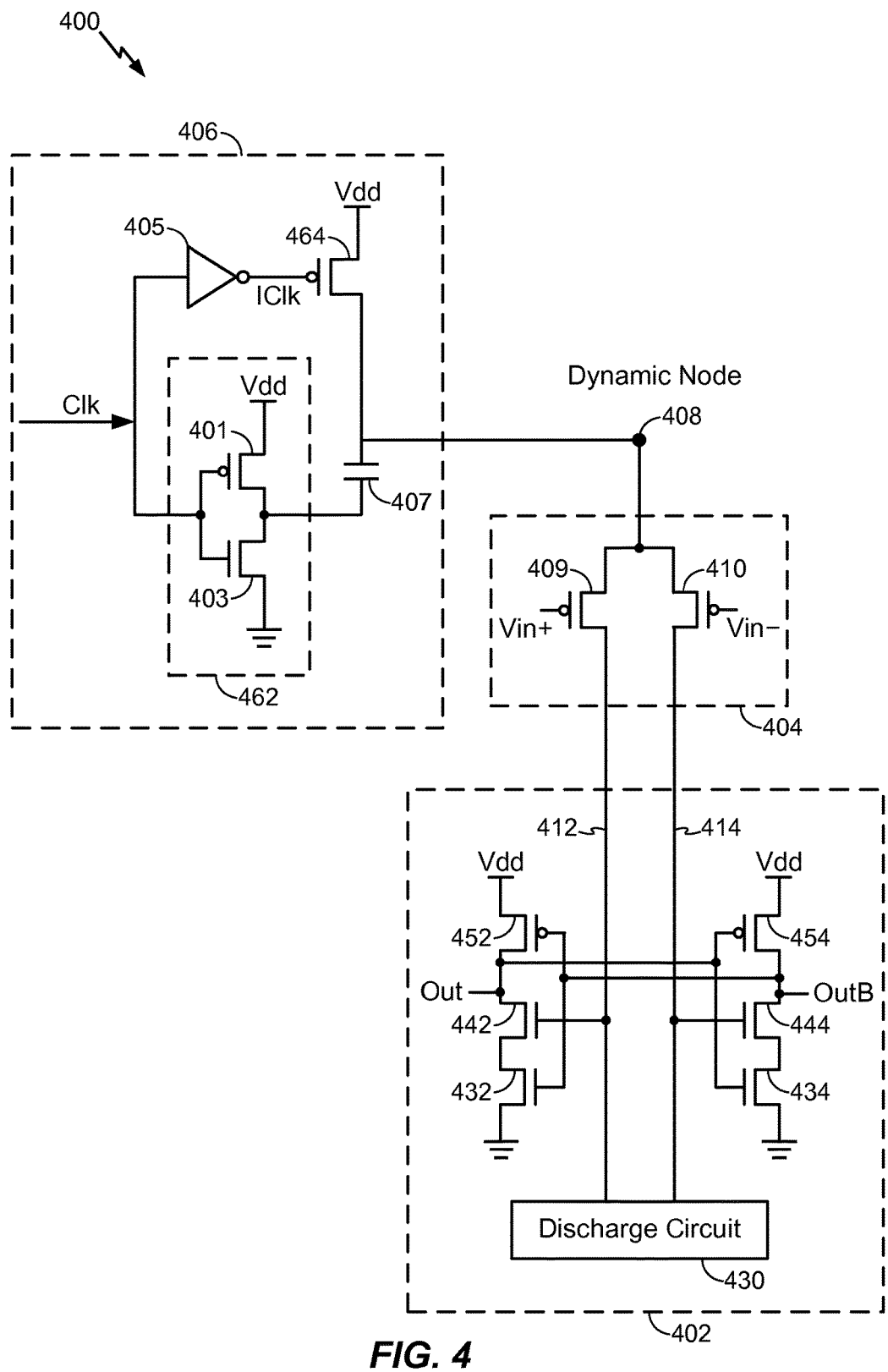
FIG. 4 is a diagram of a particular illustrative embodiment of a circuit that is operable to extend a voltage range of a comparison circuit.

Referring to FIG. 4, a circuit 400 that is operable to extend a voltage range of a comparison circuit is shown. The circuit 400 includes a latching circuit 402, a comparator 404 (i.e., a dynamic circuit or comparison circuit), and a clocked circuit 406. The latching circuit 402 is coupled to receive an output from the comparator 404. The clocked circuit 406 is coupled to the comparator 404 via a dynamic node 408.

The comparator 404 includes a first transistor 409, such as a first p-type metal-oxide semiconductor (PMOS) transistor, and a second transistor 410, such as a second PMOS transistor. A source of the first transistor 409 is coupled to the dynamic node 408 and a drain of the first transistor 409 is coupled to a first discharged node 412. A gate of the first transistor 409 is coupled to receive a first input signal (Vin+). A source of the second transistor 410 is coupled to the dynamic node 408 and a drain of the second transistor 410 is coupled to a second discharged node 414. A gate of the second transistor 410 is coupled to receive a second input signal (Vin−). Thus, the first transistor 409 may be coupled to the dynamic node 408 and responsive to the first input signal (Vin+) and the second transistor 410 may be coupled to the dynamic node 408 and responsive to the second input signal (Vin−). The first input signal (Vin+) and the second input signal (Vin−) may be common-mode input signals (e.g., a differential signal pair).

The clocked circuit 406 includes a first inverter 462 that may include a third PMOS transistor 401 and a first NMOS transistor 403. The clocked circuit 406 further includes a switch 464 (e.g., a fourth PMOS transistor), a second inverter 405, and a capacitor 407. An input of the first inverter 462 is coupled to receive a clock signal (Clk) and an output (e.g., a drain of the third PMOS transistor 401) is coupled to a first terminal (i.e., a negative terminal) of the capacitor 407. The second inverter 405 is coupled to receive the clock signal (Clk). The second inverter 405 is configured to generate an inverted clock signal (IClk) in response to receiving the clock signal (Clk). A gate of the fourth PMOS transistor (i.e., the switch 464) is coupled to receive the inverted clock signal (IClk). A source of the fourth PMOS transistor is coupled to a supply voltage (Vdd) and a drain of the fourth PMOS transistor 464 is coupled to a second terminal (i.e., a positive terminal) of the capacitor 407. The positive terminal of the capacitor 407 is coupled to the dynamic node 408.

The latching circuit 402 includes a discharge circuit 430 coupled to the first discharged node 412 and to the second discharged node 414. The latching circuit 402 also includes a pair of cross-coupled inverters. The first inverter of the pair of cross-coupled inverters includes a fifth PMOS transistor 452 and a second NMOS transistor 432. A gate of the second NMOS transistor 432 is coupled to a gate of the fifth PMOS transistor 452. A source of the fifth PMOS transistor 452 is coupled to receive a supply voltage (Vdd) and a drain of the fifth PMOS transistor 452 is coupled to a drain of a third NMOS transistor 442. A source of the second NMOS transistor 432 is coupled to ground and a drain of the second NMOS transistor 432 is coupled to a source of the fifth NMOS transistor 442. A gate of the third NMOS transistor 442 is coupled to the first discharged node 412. The second inverter of the pair of cross-coupled inverters includes a sixth PMOS transistor 454 and a fourth NMOS transistor 434. A gate of the sixth PMOS transistor 454 is coupled to a gate of the fourth NMOS transistor 434. A source of the sixth PMOS transistor 454 is coupled to receive a supply voltage (Vdd) and a drain of the sixth PMOS transistor 454 is coupled to a drain of a fifth NMOS transistor 444. A source of the fifth NMOS transistor 434 is coupled to ground and a drain of the fourth NMOS transistor 434 is coupled to a source of the fifth NMOS transistor 444. A gate of the fifth NMOS transistor 444 is coupled to the second discharged node 414.

During a reset phase, the clocked circuit 406 selectively shifts the voltage level of the dynamic node 408 to a voltage approximately equal to the supply voltage (Vdd) in response to the clock signal (Clk). For example, during the reset phase, the clock signal (Clk) transitions from a logic voltage low level to a logic high voltage level. The clock signal (Clk) is provided to a gate of the third PMOS transistor 401 and to a gate of the first NMOS transistor 403. In response to receiving the clock signal (Clk) having a logic high voltage level, the third PMOS transistor 401 is deactivated and the first NMOS transistor 403 is activated. Upon activation, the first NMOS transistor 403 is configured to selectively bias the negative terminal of the capacitor 407 to ground. The clock signal (Clk) is also provided to the second inverter 405 and the inverted clock signal (IClk) having a logic low voltage level is provided to the gate of the switch 464. The switch 464 activates in response to receiving the inverted clock signal (IClk) having a logic low voltage level, coupling the supply voltage (Vdd) to the positive terminal of the capacitor 407. Thus, during the reset phase, the capacitor 407 charges based on the supply voltage (Vdd) and the voltage of the dynamic node 408 is approximately equal to the supply voltage (Vdd).

When the voltage level of the dynamic node 408 is approximately equal to the supply voltage (Vdd), the gate-to-source voltages of the first and second transistors 409, 410 may be smaller than the threshold voltages of the first and second transistors 409, 410, respectively. The first and second transistors 409, 410 may be deactivated (or may operate in a mode of operation with a small conduction rate, such as a triode region of operation) when the gate-to-source voltages are smaller than the threshold voltages. Deactivating the first and second transistors 409, 410 may result in substantially no charging current flowing through the transistors 409, 410, and the comparator 404 may enter into an "off" state.

During a comparison phase, the clocked circuit 406 uses the charged capacitor 407 to selectively shift the voltage level of the dynamic node 408 above the supply voltage (Vdd) in response to the clock signal (Clk). For example, during the comparison phase, the clock signal (Clk) transitions from a logic high voltage level to a logic low voltage level. The clock signal (Clk) is provided to the gate of the third PMOS transistor 401 and to the gate of the first NMOS transistor 403. In response to receiving the clock signal (Clk) having a logic low voltage level, the third PMOS transistor 401 is activated and the first NMOS transistor 403 is deactivated. Upon activation, the third PMOS transistor 401 is configured to provide a voltage approximately equal to the supply voltage (Vdd) to the negative terminal of the capacitor 407. For example, the third PMOS transistor 401 may function as a pull-up transistor based on the supply voltage (Vdd) coupled to the source of the third PMOS transistor 401. The clock signal (Clk) is provided to the second inverter 405 and the inverted clock signal (IClk) having a logic high voltage level is provided to the gate of the switch 464. In response to receiving the inverted clock signal (IClk) having the logic high voltage level, the switch 464 may turn off. The dynamic node 408 is coupled to the positive terminal of the capacitor 407. Thus, the voltage of the dynamic node 408 may be equal to the voltage across the charged capacitor 407 generated during the reset phase plus the supply voltage (Vdd) at the negative terminal of the capacitor 407.

Biasing the voltage level of the dynamic node 408 to a voltage greater than the supply voltage (Vdd) may boost a common mode voltage of the common-mode input signals (Vin+, Vin−) (e.g., the differential signal pair). For example, when the voltage level of the dynamic node 408 is biased above the supply voltage (Vdd), the voltage range of the comparator 404 is extended as compared to when the voltage level of the dynamic node 408 is biased to the supply voltage (Vdd). Extending the voltage range of the comparator 404 by biasing the voltage level of the dynamic node 408 (i.e., biasing the voltage level of the source of the first transistor 409) and maintaining the voltage level of the first input signal (Vin+) may increase the gate-to-source voltage of the first transistor 409 to a level that is greater than the threshold voltage of the first transistor 409. In a similar manner, extending the voltage range of the comparator 404 by biasing the voltage level of the dynamic node 408 (i.e., biasing the voltage level of the source of the second transistor 410) and maintaining the voltage level of the second input signal (Vin−) may increase the gate-to-source voltage of the second transistor 410 to a level that is greater than the threshold voltage of the second transistor 410. When the gate-to-source voltages of the first and second transistors 409, 410 are greater than the threshold voltages of the first and second transistors 409, 410, respectively, the first and second transistors may be activated to charge the first and second discharged nodes 412, 414, respectively. As explained below, because the sources of the first and second transistors 409, 410 are coupled to a common voltage (i.e., the dynamic node 408), if the first and second transistors 409, 410 have similar characteristics (i.e., similar threshold voltages), a first and second output (Out, OutB) of the latching circuit 402 may determine the voltage difference between the first and second input signals (Vin+, Vin−).

The discharge circuit 430 discharges the first and second discharged nodes 412, 414 during the reset phase and the discharge circuit 430 may deactivate during the comparison phase. When the first and second transistors 409, 410 are activated, the first and second transistors 409, 410 function as pull-up transistors and begin to charge the first and second discharged nodes 412, 414, respectively. The third NMOS transistor 442 is responsive to a voltage of the first discharged node 412, and the fifth NMOS transistor 444 is responsive to a voltage of the second discharged node 414. For example, as the voltage of the first discharged node 412 increases, the rate at which the third NMOS transistor 442 conducts current increases. In addition, as the voltage of the second discharged node 414 increases, the rate at which the fifth NMOS transistor 444 conducts current increases.

When the voltage at the first discharged node 412 rises to a sufficient level to activate the third NMOS transistor 442, the first inverter 432, 452 of the pair of cross-coupled inverters toggles and outputs a low voltage signal at the first output (Out) of the latching circuit 402. The low voltage signal at the first output (Out) drives the second inverter 434, 454 of the pair of cross-coupled inverters to maintain a high voltage signal at the second output (OutB) of the latching circuit 402. For example, the low voltage signal at the first output (Out) may be applied to the gate of the sixth PMOS transistor 454 and to the gate of the fourth NMOS transistor 434. As a result, the sixth PMOS transistor 454 may function as a pull-up transistor and couple the second output (OutB) to ground and the fourth NMOS transistor 434 may be deactivated. When the voltage at the second discharged node 414 rises to a sufficient level to activate the fifth NMOS transistor 444, the second inverter 434, 454 of the pair of cross-coupled inverters toggles and outputs a low voltage signal at the second output (OutB). In a similar manner as the described above, the low voltage signal at the second output (OutB) drives the first inverter 432, 452 of the pair of cross-coupled inverters to maintain a high voltage signal at the first output (Out).

The first and second outputs (Out, OutB) of the latching circuit 402 indicate a relative voltage difference between the first input signal (Vin+) and the second input signal (Vin−). For example, when the first input signal (Vin+) has a voltage level smaller than the second input signal (Vin−), the first transistor 409 may conduct at a greater rate than the second transistor 410, resulting in the first discharged node 412 charging at a greater rate than the second discharged node 414. When the first discharged node 412 charges at a greater rate than the second discharged node 414, the voltage applied to the gate of the third NMOS transistor 442 activates the third NMOS transistor 442 and the first inverter 432, 452 outputs the low voltage signal at the first output (Out). Thus, when the first input signal (Vin+) has a smaller voltage than the second input signal (Vin−), the first output (Out) of the latching circuit 402 generates a low voltage signal. In a similar manner, when the second input signal (Vin−) has a smaller voltage than the first input signal (Vin+), the second output (OutB) of the latching circuit 402 generates a low voltage signal.

It will be appreciated that the circuit 400 of FIG. 4 may extend a voltage range of the comparator 404 to activate the first and second transistors 409, 410 during a comparison mode and turn off the comparator 404 during the reset mode. Turning off the comparator 404 may reduce battery power consumption.

Figure 5:
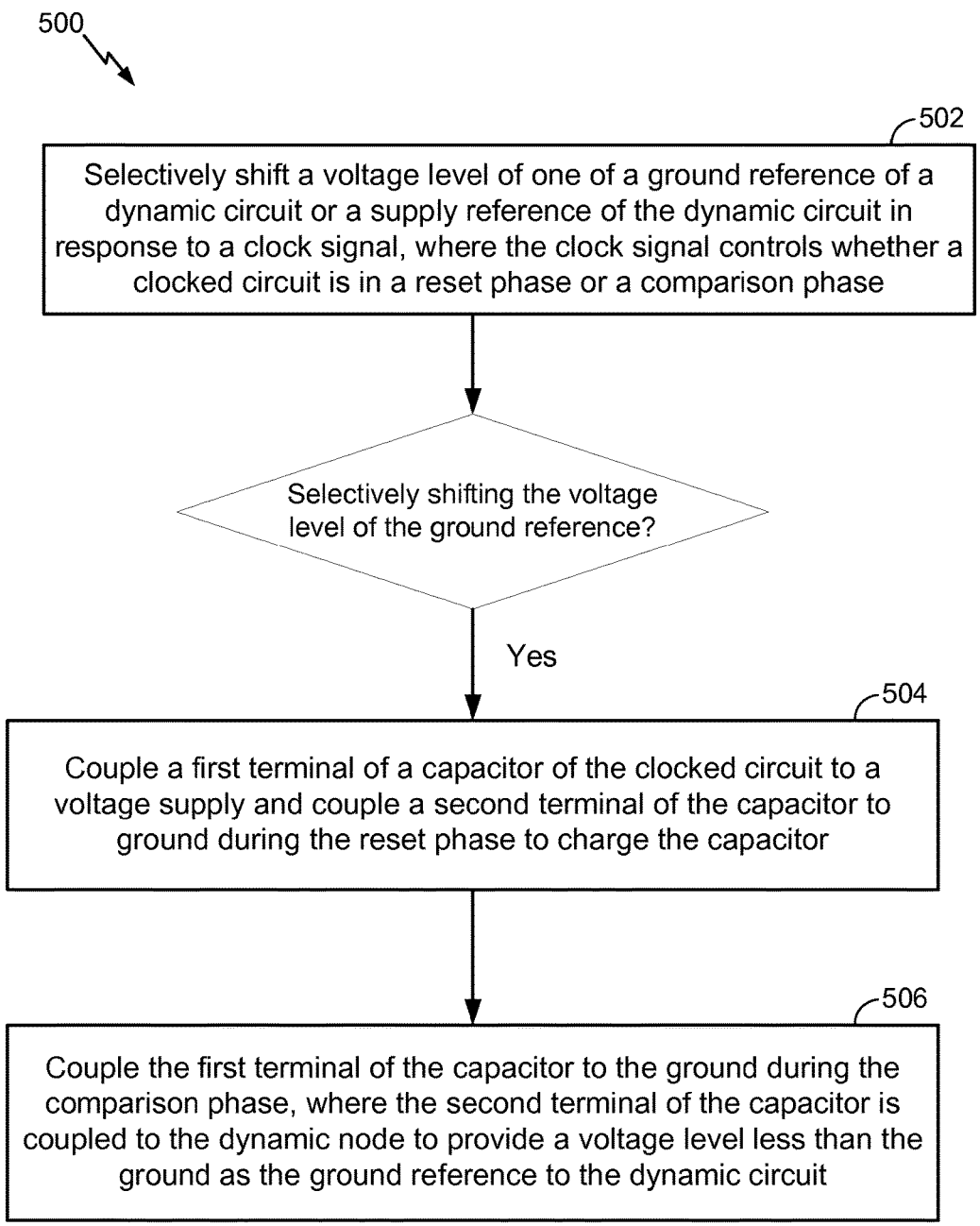
FIG. 5 is a flowchart of a particular embodiment of a method of extending a voltage range of a comparison circuit.

Referring to FIG. 5, a flowchart of a particular embodiment of a method 500 of extending a voltage range of a comparison circuit is shown. In an illustrative embodiment, the method 500 may be performed using the system 100 of FIG. 1, the circuit 200 of FIGS. 2-3, the circuit 400 of FIG. 4, or any combination thereof.

The method 500 includes selectively shifting a voltage level of one of a ground reference of a dynamic circuit or a supply reference of the dynamic circuit in response to a clock signal, at 502. For example, with reference to the embodiments illustrated in FIGS. 1-3, the clocked circuit 106 may selectively shift a voltage level of the dynamic node 108 to ground and to a voltage level less than ground (i.e., a negative voltage) in response to the clock signal (Clk). The dynamic node 108 may be a ground reference of a dynamic circuit (i.e., the comparator 104). The clock signal (Clk) may control whether the clocked circuit is in a reset phase or a comparison phase. For example, as described with respect to FIG. 2, in response to the clock signal (Clk) transitioning from a logic high voltage level to a logic low voltage level, the clocked circuit 106 operates in the reset phase and selectively biases the voltage of the dynamic node 108 to approximately ground. In addition, as described with respect to FIG. 3, in response to the clock signal (Clk) transitioning from a logic low voltage level to a logic high voltage level, the clocked circuit 106 operates in the comparison phase and selectively biases the dynamic node to a negative voltage (i.e., a voltage less than ground) to extend the voltage range of the comparator. As another example, with reference to the embodiment illustrated in FIG. 4, the clocked circuit 406 may selectively shift a voltage level of the dynamic node 408 to the supply voltage (Vdd) and to a voltage greater than the supply voltage (Vdd) in response to the clock signal (Clk). The dynamic node 408 may be a supply reference of a dynamic circuit (i.e., the comparator 404).

When selectively shifting the voltage level of the ground reference, a first terminal of a capacitor of the clocked circuit may be coupled to a voltage supply and a second terminal of the capacitor may be coupled to ground during the reset phase to charge the capacitor, at 504. For example, in FIG. 2, the first terminal of the capacitor 206 of the clocked circuit 106 is coupled to the voltage supply (Vdd) during the reset phase (i.e., when the clock signal (Clk) is at a logic low voltage level). In particular, the first PMOS transistor 201 activates and functions as a pull-up transistor when the clock signal (Clk) transitions to the logic low voltage level. When the first PMOS transistor 201 is activated, the first terminal of the capacitor 206 is coupled to the voltage supply (Vdd) through the conduction of the first PMOS transistor 201. The second terminal (i.e., the negative terminal) of the capacitor 206 of the clocked circuit 106 is coupled to ground during the reset phase. In particular, the switch 204 activates and functions as a pull-down transistor when the inverted clock signal (IClk) transitions to a logic high voltage level (i.e., when the clock signal (Clk) transitions to the logic low voltage level). When the switch 204 (e.g., the fourth NMOS transistor) is activated, the second terminal of the capacitor 206 is coupled to ground through the conduction of the fourth NMOS transistor 204.

The first terminal of the capacitor may be coupled to the ground during the comparison phase, at 506. For example, in FIG. 3, the first terminal of the capacitor 206 is coupled to the ground during the comparison phase (i.e., when the clock signal (Clk) transitions to a logic high voltage level). In particular, the third NMOS transistor 203 activates and functions as a pull-down transistor when the clock signal (Clk) transitions to the logic high voltage level. When the third NMOS transistor 203 is activated, the first terminal of the capacitor 206 is coupled to ground through the conduction of the third NMOS transistor 203. The second terminal of the capacitor 206 may be coupled to the dynamic node 108 to provide a voltage level less than the ground (i.e., a negative voltage) as the ground reference to the dynamic circuit (i.e., the comparator 104). Alternatively, in FIG. 4, the capacitor 407 may be coupled to the voltage supply (Vdd) to shift the supply reference to the dynamic circuit.

It will be appreciated that the method 500 of FIG. 5 may extend a signal comparison voltage range of the comparator 104 to activate the first and second transistors 208, 210. For example, the clocked circuit 106 may selectively bias the dynamic node 108 to a negative voltage (i.e., a voltage less than ground) to increase the gate-to-source voltage of the first and second transistors 208, 210 to a voltage level greater than a threshold voltage of the first and second transistors 208, 210. Increasing the gate-to-source voltage of the first and second transistors 208, 210 may enable the transistors 208, 210 to activate (or operate in a saturation region of operation) without increasing a voltage supply (Vdd) of the comparator 104.

Figure 6:
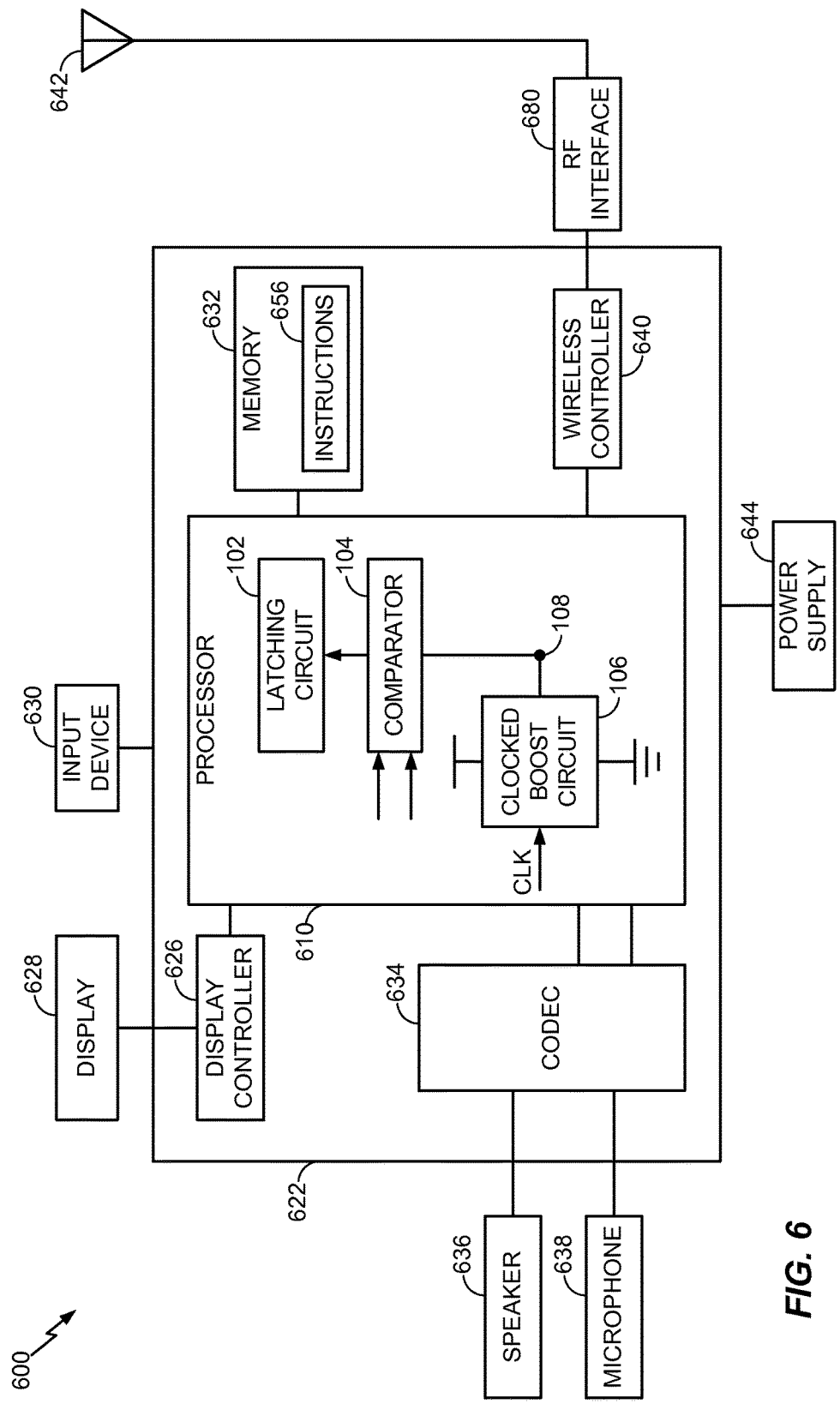
FIG. 6 is a block diagram of a wireless device including a component that is operable to extend a voltage range of a comparison circuit.

Referring to FIG. 6, a block diagram of a wireless device 600 including a component operable to extend a voltage range of a comparison circuit is shown. The device 600 includes a processor 610, such as a digital signal processor (DSP), coupled to a memory 632.

FIG. 6 also shows a display controller 626 that is coupled to the processor 610 and to a display 628. A coder/decoder (CODEC) 634 can also be coupled to the processor 610. A speaker 636 and a microphone 638 can be coupled to the CODEC 634. FIG. 6 also indicates that a wireless controller 640 can be coupled to the processor 610 and to a wireless antenna 642. A radio frequency (RF) interface 680 is disposed between the wireless controller 640 and the wireless antenna 642.

The processor 610 may include the clocked circuit 106, the comparator 104, and the latching circuit 102. In a particular embodiment, the processor 610 may be configured to selectively shift a voltage level of a ground reference of a dynamic circuit in response to a clock signal. For example, the processor 610 may transition the clock signal (Clk) to a logic low voltage level resulting in the clocked circuit 106 entering into the reset phase or transition the clock signal (Clk) to a logic high voltage level resulting in the clocked circuit 106 entering into the comparison phase.

The memory 632 may be a tangible non-transitory processor-readable storage medium that includes executable instructions 656. The instructions 656 may be executed by a processor, such as the processor 610, to selectively shift a voltage level of one of a ground reference of a dynamic circuit or a supply reference of the dynamic circuit in response to a clock signal. For example, in a particular embodiment, the instructions 656 may be executable by the processor 610 to transition the clock signal (Clk) to a logic low voltage level resulting in the clocked circuit 106 entering into the reset phase or the instructions 656 may be executable by the processor 610 to transition the clock signal (Clk) to a logic high voltage level resulting in the clocked circuit 106 entering into the comparison phase. In another embodiment, the instructions 656 may be executable by the processor 610 to transition the clock signal (Clk) of FIG. 4 to a logic low voltage level resulting in the clocked circuit 406 entering into the comparison phase or the instructions 656 may be executable by the processor 610 to transition the clock signal (Clk) of FIG. 4 to a logic high voltage level resulting in the clocked circuit 406 entering into the reset phase. In a particular embodiment, the processor 610 may determine a static rate to transition the clock signal (Clk) between a logic low voltage level to a logic high voltage level. In another particular embodiment, the processor 610 may randomly transition the clock signal (Clk) based on external factors, such as process, voltage, and temperature (PVT) variations.

In a particular embodiment, the processor 610, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the wireless antenna 642, and the power supply 644 can be coupled to a component of the system-on-chip device 622, such as an interface or a controller.

In conjunction with the described embodiments, an apparatus includes means for comparing common-mode input signals, the means for comparing coupled to a dynamic node. For example, the means for comparing the common-mode input signals may include the comparator 104 of FIGS. 1-3, the latching circuit 102 of FIGS. 1-3, the comparator 404 of FIG. 4, the latching circuit 402 of FIG. 4, the processor 610 programmed to execute the instructions 656 of FIG. 6, one or more other devices, circuits, modules, or instructions to compare common-mode input signals, or any combination thereof.

The apparatus may also include means for biasing the dynamic node to extend a signal comparison voltage range. For example, the means for biasing the dynamic node may include the clocked circuit 106 of FIGS. 1-3, the clocked circuit 406 of FIG. 4, the processor 610 programmed to execute the instructions 656 of FIG. 6, one or more other devices, circuits, modules, or instructions to bias the dynamic node to a voltage less than a ground of the common-mode input signals, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit to extend signal comparison voltage range, the circuit comprising:
   a latching circuit;
   a comparator responsive to a differential pair of input signals, the comparator coupled to the latching circuit and to a node having a dynamic voltage; and
   a clocked boost circuit coupled to the node and configured to extend a supply voltage range of the comparator via biasing the node, wherein the clocked boost circuit includes:
      an inverter coupled between a voltage supply and ground, wherein the inverter is responsive to a clock signal and wherein an output of the inverter is coupled to a first terminal of a capacitor; and
      a switch responsive to an inverted clock signal and configured to selectively couple a second terminal of the capacitor to a reference potential.

2. The circuit of claim 1, wherein the node provides a supply reference of the comparator.

3. The circuit of claim 2, wherein the comparator comprises:
   a first transistor coupled to the node and responsive to a first input signal; and
   a second transistor coupled to the node and responsive to a second input signal,
   wherein an output of the comparator indicates whether a first charge rate through the first transistor to the supply reference exceeds a second charge rate through the second transistor to the supply reference.

4. An apparatus to boost a common mode voltage of a differential signal pair, the apparatus comprising:
   a dynamic latched comparator including:
      a first transistor coupled to receive a first input signal of the differential signal pair, wherein a source of the first transistor is coupled to a node having a dynamic voltage; and
      a second transistor coupled to receive a second input signal of the differential signal pair, wherein a source of the second transistor is coupled to the node; and
   a clocked boost circuit including a capacitor coupled to the node, wherein the capacitor is selectively charged in response to a clock signal, wherein the capacitor selectively biases the node to boost the common mode voltage, and wherein the clocked boost circuit includes:
      an inverter coupled between a voltage supply and ground, wherein the inverter is responsive to a clock signal and wherein an output of the inverter is coupled to a first terminal of the capacitor; and
      a switch responsive to an inverted clock signal and configured to selectively couple a second terminal of the capacitor to a reference potential.

5. The apparatus of claim 4, wherein the first transistor and the second transistor are p-type metal oxide semiconductor (PMOS) transistors, and wherein boosting the common mode voltage includes biasing the node to a voltage greater than a supply voltage.

6. The circuit of claim 5, wherein the clocked boost circuit includes:
   an inverter coupled between a voltage supply and ground, wherein the inverter is responsive to a clock signal and wherein an output of the inverter is coupled to the first terminal of the capacitor; and
   a switch responsive to an inverted clock signal and configured to selectively couple a second terminal of the capacitor to the supply voltage.

* * * * *